US008460753B2

(12) United States Patent
Xiao et al.

(10) Patent No.: US 8,460,753 B2
(45) Date of Patent: Jun. 11, 2013

(54) METHODS FOR DEPOSITING SILICON DIOXIDE OR SILICON OXIDE FILMS USING AMINOVINYLSILANES

(75) Inventors: Manchao Xiao, San Diego, CA (US); Liu Yang, Yorba Linda, CA (US); Kirk Scott Cuthill, Vista, CA (US); Heather Regina Bowen, Vista, CA (US); Bing Han, Lansdale, PA (US); Mark Leonard O'Neill, San Marcos, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 12/964,266

(22) Filed: Dec. 9, 2010

(65) Prior Publication Data

US 2012/0148745 A1    Jun. 14, 2012

(51) Int. Cl.
*C23C 16/40*    (2006.01)

(52) U.S. Cl.
USPC ............ 427/255.31; 427/255.37; 117/84; 117/88

(58) Field of Classification Search
USPC .............. 427/255.31, 255.37; 117/84, 88
See application file for complete search history.

(56) References Cited

U.S. PATENT DOCUMENTS

| | | | | |
|---|---|---|---|---|
| 4,863,755 A | * | 9/1989 | Hess et al. | 427/574 |
| 6,391,803 B1 | * | 5/2002 | Kim et al. | 438/787 |
| 2004/0018304 A1 | * | 1/2004 | Chung et al. | 427/250 |
| 2004/0018694 A1 | * | 1/2004 | Lee et al. | 438/400 |
| 2007/0173024 A1 | * | 7/2007 | Goktepeli et al. | 438/299 |
| 2007/0275568 A1 | | 11/2007 | Miyoshi et al. | |
| 2008/0199977 A1 | * | 8/2008 | Weigel et al. | 438/4 |
| 2009/0232985 A1 | | 9/2009 | Dussarrat et al. | |
| 2010/0120262 A1 | * | 5/2010 | Vorsa et al. | 438/786 |
| 2010/0140756 A1 | * | 6/2010 | Kozasa et al. | 257/635 |
| 2010/0291321 A1 | | 11/2010 | Mallikarjunan et al. | |
| 2011/0121430 A1 | * | 5/2011 | Zagwijn et al. | 257/618 |

FOREIGN PATENT DOCUMENTS

| | | | |
|---|---|---|---|
| EP | 1 464 726 A2 | | 10/2004 |
| EP | 2 116 632 A2 | | 11/2009 |
| EP | 2 228 465 A1 | | 9/2010 |
| EP | 2251899 | * | 11/2010 |
| GB | 1352951 | * | 5/1974 |
| WO | 2009006272 | | 1/2009 |

OTHER PUBLICATIONS

Feller, J.F., et al., "Coupling ability of silane grafted poly(propene) at glass fibers/poly(propene) interface." Composites: Part A 35 (2004) pp. 1-10.*

* cited by examiner

*Primary Examiner* — Bret Chen
(74) *Attorney, Agent, or Firm* — Rosaleen P. Morris-Oskanian

(57) ABSTRACT

Described herein are methods to form silicon dioxide films that have extremely low wet etch rate in HF solution using a thermal CVD process, ALD process or cyclic CVD process in which the silicon precursor is selected from one of:

$R^1{}_nR^2{}_m Si(NR^3R^4)_{4-n-m}$; and, a cyclic silazane of $(R^1R^2SiNR^3)_p$, where $R^1$ is an alkenyl or an aromatic, such as vinyl, allyl, and phenyl; $R^2$, $R^3$, and $R^4$ are selected from H, alkyl with $C_1$-$C_{10}$, linear, branched, or cyclic, an alkenyl with $C_2$-$C_{10}$ linear, branched, or cyclic, and aromatic; n=1-3, m=0-2; p=3-4.

16 Claims, 4 Drawing Sheets

METHODS FOR DEPOSITING SILICON DIOXIDE OR SILICON OXIDE FILMS USING AMINOVINYLSILANES

BACKGROUND OF THE INVENTION

Thin films of silicon dioxide, silicon nitride, and mixtures thereof are some of the most commonly used materials in semiconductor manufacturing due to their excellent dielectric properties. In the manufacturing of silicon based semiconductor devices, these materials can be used as gate insulation, diffusion masks, side wall spacers, hard mask, anti-reflection coating, passivation and encapsulation, etc. Silicon-based films are also becoming increasingly important for passivation of other compound semiconductor devices.

When silicon-based films are used in conjunction with wet etch process, an important and routine production process for the fabrication of silicon integrated circuits, the wet etch rate of silicon dioxide films are critical to many applications. In some cases (e.g., when the silicon dioxide is used side wall), the etch rate in HF solution needs to extremely slow since a too fast and aggressive action on the material would make it difficult to control the undercut and the line-width. A slower, controllable etch rate is desirable for a better manufacturing process, supporting higher yield of semiconductor devices. In some other cases where silicon-based films are used as etch stops, hard masks, or passivation layers, it is desirable for the material to be extremely resistant to wet etching.

Existing approaches of forming silicon-based films that have low etch rate in HF solution are
(1) depositing the films at higher temperatures to reduce the defects such as porosity or hydrogen concentration in the film, or
(2) adding other precursors to the deposition process in addition to silicon or nitrogen during the deposition process to bring in additional elements to modify film properties.

Since higher temperatures may not always be desirable, and the use of multiple precursors can add complexity to the process, alternatives to controlling film properties are desired.

Prior art in this field includes US Published Patent Application U.S.2010/0120262 and U.S. patent application Ser. No. 12/772,518 filed May 3, 2010.

BRIEF SUMMARY OF THE INVENTION

The present invention is a low pressure, thermal chemical vapor deposition method of forming a silicon dioxide film that has extremely low wet etch rate in HF solution, comprising:
  a. delivering a first precursor that provides a source for silicon to a low pressure, thermal chemical vapor deposition reactor in which the first precursor is selected from the group consisting of: $R^1{}_nR^2{}_mSi(NR^3R^4)_{4-n-m}$, and a cyclic silazane of $(R^1R^2SiNR^3)_p$; where $R^1$ is an alkenyl or an aromatic, such as vinyl, allyl, and phenyl; $R^2$, $R^3$, and $R^4$ are selected from H, alkyl with $C_1$-$C_{10}$, linear, branched, or cyclic, an alkenyl with $C_2$-$C_{10}$ linear, branched, or cyclic, and aromatic; and n=1-3, m=0-2, p=3-4;
  b. delivering a second precursor that provide a source for oxygen to the reactor;
  c. reacting the first and second precursors at temperature between 400° C. to 700° C. under a pressure of 100 mT to 1T.

The present invention is also an atomic layer deposition method of forming a silicon dioxide film that has extremely low wet etch rate in HF solution, comprising:
  a. delivering a first precursor that provides a source for silicon to an atomic layer deposition reactor in which the first precursor is selected from the group consisting of: $R^1{}_nR^2{}_mSi(NR^3R^4)_{4-n-m}$, and a cyclic silazane of $(R^1R^2SiNR^3)_p$; where $R^1$ is an alkenyl or an aromatic, such as vinyl, allyl, and phenyl; $R^2$, $R^3$, and $R^4$ are selected from H, alkyl with $C_1$-$C_{10}$, linear, branched, or cyclic, an alkenyl with $C_2$-$C_{10}$ linear, branched, or cyclic, and aromatic; and n=1-3, m=0-2, p=3-4;
  b. purging the reactor with an inert gas;
  c. delivering a second precursor that provide a source for oxygen to the reactor;
  d. purging the reactor with an inert gas;
  e. repeating the steps between (a) and (d) until a desired thickness of the films is achieved.

Further, the present invention is a cyclic chemical vapor deposition method of forming a silicon dioxide film that has extremely low wet etch rate in HF solution, comprising:
  a. delivering a first precursor that provides a source for silicon to a cyclic chemical vapor deposition reactor in which the first precursor is selected from the group consisting of: $R^1{}_nR^2{}_mSi(NR^3R^4)_{4-n-m}$, and a cyclic silazane of $(R^1R^2SiNR^3)_p$; where $R^1$ is an alkenyl or an aromatic, such as vinyl, allyl, and phenyl; $R^2$, $R^3$, and $R^4$ are selected from H, alkyl with $C_1$-$C_{10}$, linear, branched, or cyclic, an alkenyl with $C_2$-$C_{10}$ linear, branched, or cyclic, and aromatic; and n=1-3, m=0-2, p=3-4;
  b. purging the reactor with an inert gas for 0.1 to 1 seconds;
  c. delivering a second precursor that provides a source of oxygen to the reactor;
  d. purging the reactor with an inert gas for 0.1-1 seconds;
  e. repeating the steps between (a) and (d) until a desired thickness of the films is achieved.

DETAILED DESCRIPTION OF THE INVENTION

Figure 1:
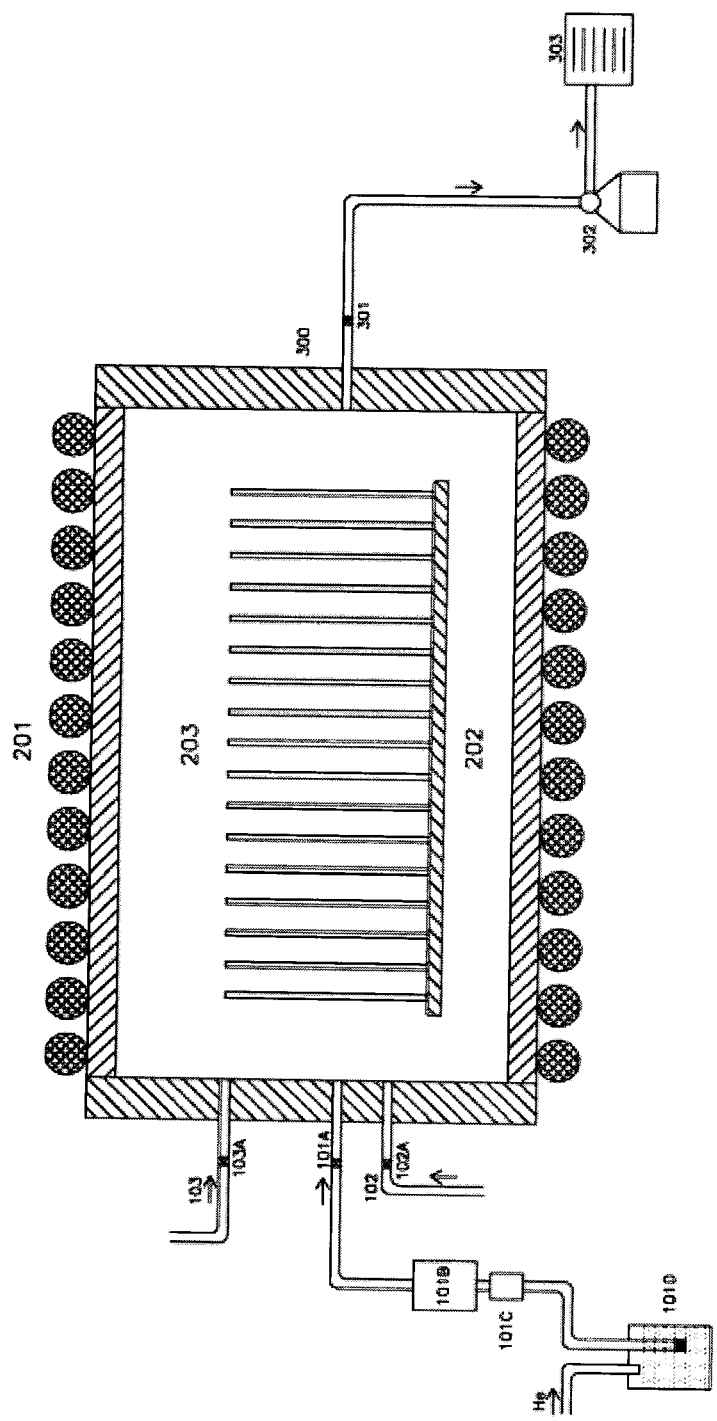
FIG. 1 is a schematic illustration of a cross-section of a CVD reactor.

In one aspect, this invention discloses a method of forming silicon-based films that have extremely low wet etch rate in HF solution using a thermal CVD process. The said method comprises:
  a) Placing a substrate in a concealed reactor that is at a temperature of 400-700° C., is purged with Ar or $N_2$ gas and maintained at a pressure below 1 Torr;
  b) Feeding the reactor with a silicon precursor that is delivered using a direct liquid injector and has one of the following structures:
    $R^1{}_nR^2{}_mSi(NR^3R^4)_{4-n-m}$; and,
    a cyclic silazane of $(R^1R^2SiNR^3)_p$; such as:

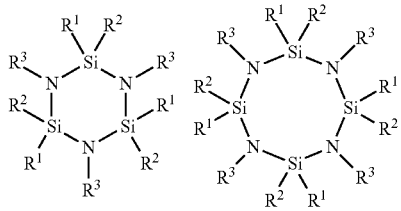

where $R^1$ is a $C_2$-$C_{10}$ alkenyl or an aromatic, such as vinyl, allyl, and phenyl; $R^2$, $R^3$, and $R^4$ are selected from H, alkyl with $C_1$-$C_{10}$, linear, branched, or cyclic, an alkenyl with $C_2$-$C_{10}$ linear, branched, or cyclic, and aromatic. n=1-3, m=0-2; p=3-4;

c) At the same time, feeding the reactor with oxygen precursor such as pure oxygen or ozone;

d) A pressure of 100 mTorr to 600 mTorr is maintained during the deposition process.

In another aspect, this invention features a method of forming silicon dioxide films that have extremely low wet etch rate in HF solution using an atomic layer deposition process. The said method comprises:

a) Placing a substrate in a concealed reactor that is at a temperature of 100-600° C., is purged with Ar or $N_2$ gas and maintained at a pressure below 1 Torr;

b) Feeding the reactor with a silicon precursor that is delivered using a direct liquid injector and has one of the following structures:
$R^1{}_nR^2{}_mSi(NR^3R^4)_{4-n-m}$; and,
a cyclic silazane of $(R^1R^2SiNR^3)_p$; such as:

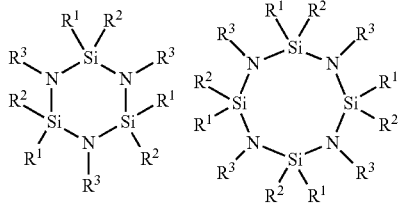

Where $R^1$ is a $C_2$-$C_{10}$ alkenyl or an aromatic, such as vinyl, allyl, and phenyl; $R^2$, $R^3$, and $R^4$ are selected from H, alkyl with $C_1$-$C_{10}$, linear, branched, or cyclic, an alkenyl with $C_2$-$C_{10}$ linear, branched, or cyclic, and aromatic. n=1-3, m=0-2; p=3-4;

c) The dose of the silicon precursor is just enough to form a monolayer of the precursor molecule on the surface of the substrate. The excess of the precursor is removed from the reactor;

d) After the reactor is purged with Ar or $N_2$ again, feeding the reactor with oxygen precursor such as pure oxygen or ozone; Again, the dose of the oxygen precursor is just enough to completely react with the monolayer silicon precursor on the substrate formed during the last step;

e) Repeating the steps b) to d) until a desired thick of the film is reached.

In another aspect, this invention features a method of forming silicon dioxide films that have extremely low wet etch rate in HF solution using a cyclic chemical vapor deposition process. The said method comprises:

a) Placing a substrate in a concealed reactor that is at a temperature of 400-700° C., is purged with Ar or $N_2$ gas and maintained at a pressure below 1 Torr;

b) Feeding the reactor with a silicon precursor that is delivered using a direct liquid injector and has one of the following structures:
$R^1{}_nR^2{}_mSi(NR^3R^4)_{4-n-m}$; and,
a cyclic silazane of $(R^1R^2SiNR^3)_p$; such as:

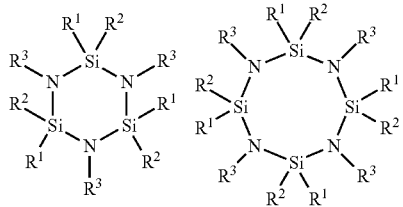

where $R^1$ is an alkenyl or an aromatic, such as vinyl, allyl, and phenyl; $R^2$, $R^3$, and $R^4$ are selected from H, alkyl with $C_1$-$C_{10}$, linear, branched, or cyclic, an alkenyl with $C_2$-$C_{10}$ linear, branched, or cyclic, and aromatic. n=1-3, m=0-2; p=3-4;

c) The dose of the silicon precursor is adjusted (increased or reduced) to achieve a desired deposition rate of the film;

d) Feeding the reactor with oxygen precursor such as pure oxygen or ozone; Again, the dose of the oxygen precursor is adjusted (increased or reduced) to achieve a desired deposition rate of the film;

e) Purging the reactor with Ar or $N_2$;

f) Repeating steps b) to e) until a desired thick of the film is reached.

The amino vinylsilane precursors include, but not limited to, Bis(isopropylamino)vinylmethylsilane (BIPAVNS), Bis(isopropylamino)divinylsilane (BIPADVS), Bis(isopropylamino)vinylsilane, Bis(isopropylamino)allylmethylsilane, Bis(isopropylamino)diallylsilane, Bis(isopropylamino)allylsilane, Bis(t-butylamino)vinylmethylsilane, Bis(t-butylaminoamino)divinylsilane, Bis(t-butylaminoamino)vinylsilane, Bis(t-butylaminoamino)allylmethylsilane, Bis(t-butylaminoamino)diallylsilane, Bis(t-butylaminoamino)allylsilane, Bis(diethylamino)vinylmethylsilane, Bis(diethylamino)divinylsilane, Bis(diethylamino)vinylsilane, Bis(diethylamino)allylmethylsilane, Bis(diethylamino)diallylsilane, Bis(diethylamino)allylsilane, Bis(dimethylamino)vinylmethylsilane, Bis(dimethylamino)divinylsilane, Bis(dimethylamino)vinylsilane, Bis(dimethylamino)allylmethylsilane, Bis(dimethylamino)diallylsilane, Bis(dimethylamino)allylsilane, Bis(methylethylamino)vinylmethylsilane, Bis(methyethylamino)divinylsilane, Bis(methyethylamino)vinylsilane, Bis(methyethylamino)allylmethylsilane, Bis(methyethylamino)diallylsilane, Bis(methyethylamino)allylsilane, Dipiperidinovinylmethylsilane, Dipiperidinodivinylsilane, Dipiperidinovinylsilane, Dipiperidinoallylmethylsilane, Dipiperidinodiallylsilane, Dipiperidinoallylsilane, Dipyrrolidinovinylmethylsilane, Dipyrrolidinodivinylsilane, Dipyrrolidinovinylsilane, Dipyrrolidinoallylmethylsilane, Dipyrrolidinodiallylsilane, Dipyrrolidinoallylsilane, Tris(isopropylamino)vinylsilane, Tris(isopropylamino)allylsilane, Tris(t-butylamino)vinylsilane, Tris(t-butylamino)allylsilane, Tris(diethylamino)vinylsilane, Tris(diethylamino)allylsilane, Tris(dimethylamino)vinylsilane, Tris(dimethylamino)allylsilane, Tris(methylethylamino)vinylsilane, Tris(methylethylamino)allylsilane, Tripiperidinovinylsilane, Tripiperidinoallylsilane, Tripyrrolidinovinylsilane, Tripyrrolidinoallylsilane, 1,3,5-trivinyl-1,3,5- trimethylcyclotrisilazane, 1,3,5-trivinylcyclotrisilazane, 1,1,3,3,5,5-hexavinylcyclotrisilazane, 1,3,5-triallyl-1,3,5-trimethylcyclotrisilazane, 1,3,5-triallylcyclotrisilazane, 1,1,3,3,5,5-hexaallylcyclotrisilazane, 1,3,5,7-tetravinyl-1,3,5,7-tetramethylcyclotetrasilazane, 1,3,5,7-tetravinylcyclotetrasilazane, 1,1,3,3,5,5,7,7-octavinylcyclotetrasilazane, 1,3,5,7-tetraallyl-1,3,5,7-tetramethylcyclotetrasilazane, 1,3,5,7-tetraallylcyclotetrasilazane, 1,1,3,3,5,5,7,7-octaallylcyclotetrasilazane.

The particular precursor used in tests is Bis(iso-propylamino)vinylmethylsilane (BIPAVMS). Another similar precursor is Bis(iso-propylamino)divinylsilane (BIPADVS).

The method described in this invention can be demonstrated using a low pressure hot wall CVD reactor illustrated in FIG. 1. The CVD reactor 300 is heated by the surrounding heating element 201. All the wafers 203 are loaded on to a wafer holder 202 that ensures they are placed along the axis of the CVD reactor so that they can be heated uniformly within each wafer. The number of the wafers in a single run can be as many as 25.

Before the film deposition process starts, the CVD tube is filled with inert gas (e.g. Ar or $N_2$) through inlet 103 and then pumped using a vacuum pump or process pump 302 to a vacuum level below 1 mT and exhausted through abatement 303. The CVD reactor is then filled with inert gas again and heated to a temperature at which the deposition is set to begin. Once the CVD reactor reaches the set temperature, the valve 103A is closed and valves 101A and 102A opens to introduce precursor vapor and reactive gas into the CVD reactor. The pressure of the CVD reactor is controlled by varying the opening of the throttle valve 301.

The reactive gas (e.g. $O_2$) flows into the CVD reactor through inlet 102 and the flow rate is controlled by a mass flow controller (MFC). The silicon precursor is in liquid form and filled in a liquid container 101D. High pressure He gas is used to help push the liquid into a vaporizer 101B that heats the liquid and vaporizes the liquid. The flow the liquid precursor is controlled using a liquid flow controller (LFC). The flow rate of the precursor vapor can be controlled by LFC 101C and the heating temperature of the vaporizer 101B: for a given setting of LFC, the higher the temperature of the vaporizer, the bigger the flow rate of the precursor vapor; for a given temperature setting of the vaporizer, the higher the flow rate of the LCF, the bigger the flow rate of the precursor vapor. The valve 101A opens or stops the flow of the precursor vapor to the CVD reactor.

The pressure of the CVD reactor can be in the range of about 0.01T to about 1T. The flow rate of the reactive gas (e.g. $O_2$) can be in the range of 5 sccm to 200 sccm. The flow rate of the Si precursor vapor can be in the range of 5 sccm to 200 sccm. The deposition temperature is the same as the reactor wall temperature. It can be in the range of 500° C. to 700° C.

The deposition time is pre-set for the process to yield films with a desired thickness. The deposition rate is dependent of many processing parameters, including: the deposition temperature, the flow rate of $O_2$, the flow rate of carrier gas (He), the liquid mass flow of the Si precursor, the temperature of the vaporizer, and the pressure of the reactor. The vaporizer temperature can be in the range of 20° C. to 150° C. At the vaporizer temperature of 55° C., the rate of the deposition is about 0.5 nm/min.

The rate of the deposition of the $SiO_2$ can be in the range of 0.1 nm to 10 nm per minute. The rate can be controlled by varying the deposition temperature, the vaporizer temperature, the flow of the LFC, the flow rate of the reactive of $O_2$ gas and the pressure at the CVD reactor.

Figure 2:
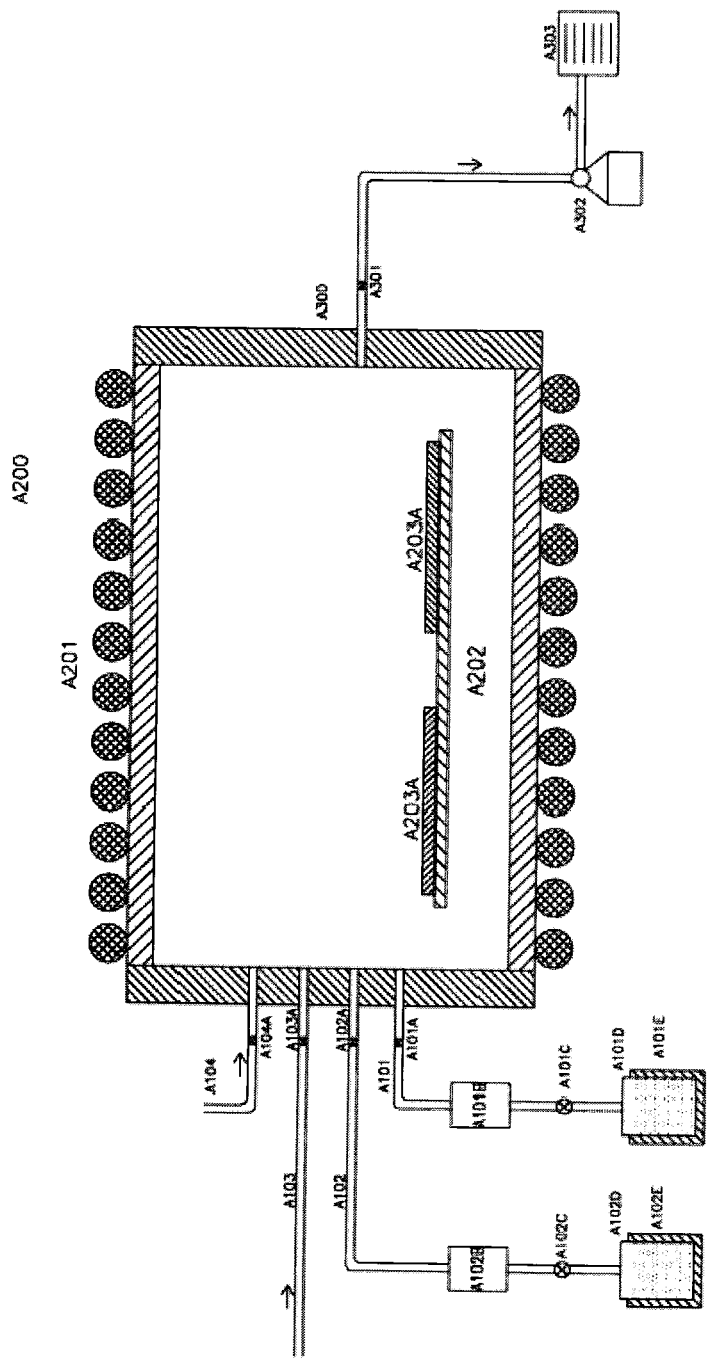
FIG. 2 is a schematic illustration of a cross-section of a ALD reactor.

The method of forming uniform nitrogen free silicon dioxide films using an ALD process can be demonstrated using an ALD reactor illustrated in FIG. 2. An ALD reactor A200 consists of a chamber wall A300 and substrate holder A202. Both of them can be heated separately at different temperatures. Wafers (or substrates) A203A are placed on A202 during the deposition process.

Before the film deposition process starts, the ALD reactor A200 is filled with inert gas (e.g. Ar or $N_2$) through inlet A104 and valve A104A and them pumped using a vacuum pump or process pump A302 to a vacuum level below 1 mT and exhausted to abatement A303. The ALD reactor A200 is then filled with inert gas again and the substrate holder A202 and the reactor wall are heated by heaters A201 to a temperature at which the deposition is set to begin.

The Si precursor is delivered from a vapor draw A101 that is heated by an electric heater A101E surrounding Si precursor container A101D and maintained at a constant temperature during the deposition. The flow of the Si precursor is controlled through a high speed ALD valve A101A, mass flow controller A101B and valve A101C. The temperature is between 20° C. to 100° C. Helium can be introduced simultaneous with the Si precursor through line A103 and valve A103A. The oxygen precursor is delivered through a container A102D having heater A102E through a high speed ALD valve A102A controlling line A102 along with mass flow controller A102B and valve A102C.

The sequence of the ALD process is as follows:

Feed silicon precursor reactor A200 for 0.1-10 seconds by closing valve A301 and opening valve A101A for the same amount of time;

Purge reactor A200 for 0.5-5 seconds by closing valve A101A and opening valve A301 and A104A for the same amount of time;

Feed oxygen into reactor A200 for 0.1-10 seconds by closing valve A301 and opening valve A102A for the same amount of time;

Purge reactor A200 for 0.5-5 seconds by closing valve A102a and opening valve A301 for the same amount of time;

Repeat the above cycles for a number of times until a desired thickness of the film is achieved.

Cyclic CVD process

The cyclic CVD process of forming uniform nitrogen free silicon dioxide films can also be illustrated in FIG. 2. The same ALD reactor can be used for the cyclic CVD process. The major difference in the cyclic CVD process to deposit uniform nitrogen free films is that the dosages of the silicon precursor and oxygen precursor can be much bigger than the ones used for ALD, and thus the deposition rate can be much higher than ALD. The deposition temperature, however, is 400-700° C., much higher than that used for ALD process.

The sequence of the cyclic CVD process is as follows:

Feed silicon precursor reactor A200 for 5-20 seconds by closing valve A301 and opening valve A101A for the same amount of time;

Purge reactor A200 for 0.1-1 seconds by closing valve A101A and opening valves A301 and A104A for the same amount of time Feed oxygen to reactor A200 for 5-20 seconds by closing valve A301 and opening valve A102A for the same amount of time;

Purge reactor A200 for 0.1-1 seconds by closing valve A102A and opening valves A301 and A104A for the same amount of time;

Repeat the above cycles for a number of times until a desired thickness of the film is achieved.

Film Thickness and Optical Property

The characterization of thickness and optical properties such as refractive index of the oxide films is performed using a FilmTek 2000SE ellipsometer. Spectroscopic reflection data at normal incidence (angle of incidence=0°) are used for the data fitting. The range of wavelength of the light used is between 200 nm to 900 nm. Since the extinction coefficient (k) for $SiO_2$ is zero when the wavelength of the light is between 200 nm and 4000 nm and the dispersion of $SiO_2$ is well known, the data are only fit on the high frequency dielectric constant. The thickness and refractive index of the oxide film can be obtained by fitting the reflection data from the film to a pre-set physical model (e.g., the Lorentz Osicllator model). The RMSE (root of mean square error) is used to determine the goodness of the fitting and the valve has to be less than 1% for the results of the measurement to be considered reliable.

Chemical Composition

The characterization of the chemical composition of the films is accomplished with X-ray Photoelectron Spectrometry (XPS). The X-ray Photoelectron Spectroscopy experiments are performed on a PHI 5000 VersaProbe Spectrometer equipped with Multiple Channels Plates (MCD) and a focused Al monochromatic X-ray source. The low resolution survey scan is performed at 117.4 eV Pass Energy, 1.000 eV/Step and a 50 msec/step dwell time. The high resolution multiplex scans are performed at 23.50 eV Pass Energy, 0.100 eV/Step and a 100 msec/step dwell time. The analysis area is 200 microns in diameter with a take-off angle of 45°. The data is collected using vendor supplied software. CasaXPS is used to work up the data using transmission function corrected Area Sensitivity Factors (ASF). All spectra are charge corrected to $CH_x$=284.8 eV. The etch rate is calibrated against 203 nm $SiO_2$/Si and is approximately 120 A/min.

Etch Rate in Diluted HF Solution

The etch test is carried out at 1 wt % HF (in deionized (DI) water) solution. The films (deposited on Si wafers) are placed in HF solution for 30 seconds, followed by rinsing in DI wafer and drying before being measured again for the loss of the material during the etch. Two thermal silicon oxide films with a known and consistent etch rate as references are loaded in the same cassette with the films to be characterized and etched at the same time. The films, along with reference thermal oxide films, are measured for their thickness at 9 different points across the film surface before and after etch using an ellipsometer and a method described above. The etch rate is then calculated as the thickness reduction divided by the time that the films are immersed into the HF solution.

Dielectric Constants

Dielectric constants, k, are calculated from a C-V curve measured with a MDC 802B-150 Mercury Probe. It consists of a probe stage that holds the sample and forms electrical contacts on the film to be measured, a Keithley 236 source meter and HP4284A LCR meter for C-V measurement. Si wafers that have relatively low electrical resistivity (sheet resistance less than 0.02 ohm-cm) are used to deposit the films for C-V measurement. Front contact mode is used to form electrical contacts to the film. Liquid metal (mercury) is pushed out through a thin tube from a reservoir to the surface of the wafer to form two electrically conductive contacts. The contact areas are calculated based on the diameter of the tube from which the mercury is pushed out. The dielectric constant is then calculated from the formula: k=the capacitance×the contact area/the thickness of the film.

EXAMPLE 1

The Chemical Compositions of the Film

Figure 3:
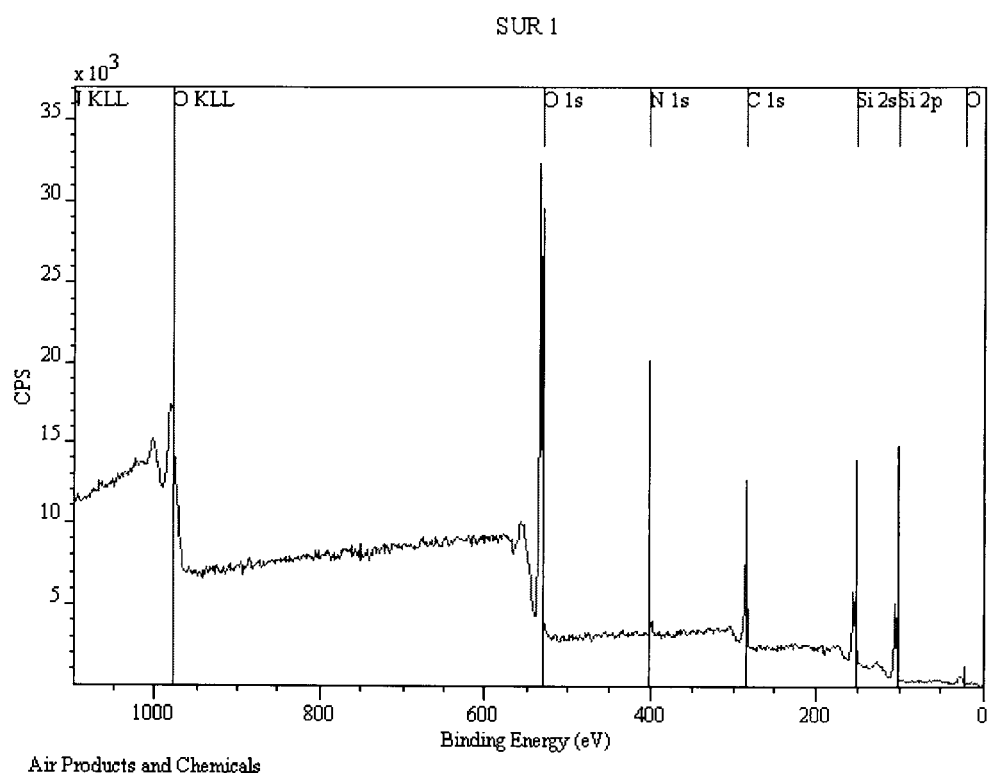
FIG. 3 is an X-ray Photoelectron Spectroscopy (XPS) of a low etch $SiO_2$ film.

A typical XPS of the highly uniform nitrogen free films is shown in FIG. 3 and the composition of the different elements including nitrogen is also listed in Table 1. As can be seen from both FIG. 3 and Table 1, no significant nitrogen is detected in the films.

TABLE 1

Chemical Composition of the Low Etch Rate Silicon Dioxide Film (in at %)

| | Elements | | | |
|---|---|---|---|---|
| | O | Si | C | N |
| Concentration | 70.4 | 20.5 | 7.9 | 1.2 |

EXAMPLE 2

The Thickness and Etch Rate of the Film

The silicon dioxide films formed using the said invention are measured for their thickness using an ellisopmeter. The film was etched in a 1 wt % HF solution along with standard thermal silicon dioxide. The etch rate was then calculated from film thickness measurements and compared with that of thermal oxide. The result is listed in Table 2. As can be seen from Table 2, the wet etch rate of the low etch rate $SiO_2$ (Present Invention) is much lower than even thermal oxide film.

TABLE 2

Wet etch rate of low etch rate $SiO_2$ and standard thermal $SiO_2$ (A/min)

| Material | After 15 second etch | After 1 minute etch | After 2 minute etch |
|---|---|---|---|
| Thermal $SiO_2$ | 43.2 | 27.6 | 29.4 |
| Low etch $SiO_2$ (Present Invention) | 1.2 | 1.2 | 1.2 |

EXAMPLE 3

Silicon Oxide Deposition

Using an ATV PE0612 brand low pressure chemical vapor deposition (LPCVD) reactor we loaded twenty five 100 mm Si wafers per deposition run. Upon closing the door to the reactor, we would start the automatic system sequencer to begin the process. The sequence would initially pump the chamber down to a base pressure of ~1-5 mtorr for about 10 minutes. Then the process would introduce nitrogen purge gas (~40 to 50 sccm) and begin control the chamber pressure using a throttle valve to obtain the proper process pressure (125 to 500 mtorr.) The process would then ramp the chamber up to the desired process temperature (550° C. or 600° C.), this would take approximately 30 minutes. Upon reaching the process temperature, the wafer temperature was allowed to stabilize for 30 minutes, while still allowing the nitrogen purge gas to flow and maintaining process pressure. After the stabilization period was complete, the nitrogen purge gas flow was shut off and the precursor (Bis(isopropylamino)vinylmethylsilane) and the oxygen began to flow while still maintaining the process pressure and temperature. The precursor (Bis(isopropylamino)vinylmethylsilane) flow was ~14 to 19 sccm. The oxygen flow was 20 sccm or 40 sccm. After the deposition step was completed, the precursor (Bis(isopropylamino)vinylmethylsilane) and the oxygen were turn off and the nitrogen purge gas was allow to flow. The throttle valve was set to open to allow for purging of the chamber of the precursor (Bis(isopropylamino)vinylmethylsilane) and oxygen. At this point the system began to ramp the process chamber down to ~60° C. for unloading of the wafers. The ramp normally takes about 60 minutes to cool down. Upon completion of the process, the system will automatically backfill the chamber with nitrogen and bring it up to atmospheric pressure, and the door to chamber can be opened for unloading the wafers.

Using a Rudolph FOCUS Automatic Ellipsometer, 3 to 20 wafers per deposition were measured. A nine point measuring pattern was used for each wafer. The average film thickness measured varied from 350 A° to 1000 A°, depending upon the process used. That means that means that the deposition rate varied from 5.8 A°/min. to 17 A°/min. Wafer thickness uniformity varied from 2.0% to 6.9%. The average refractive index measured varied from 1.4375 to 1.4828.

Figure 4:
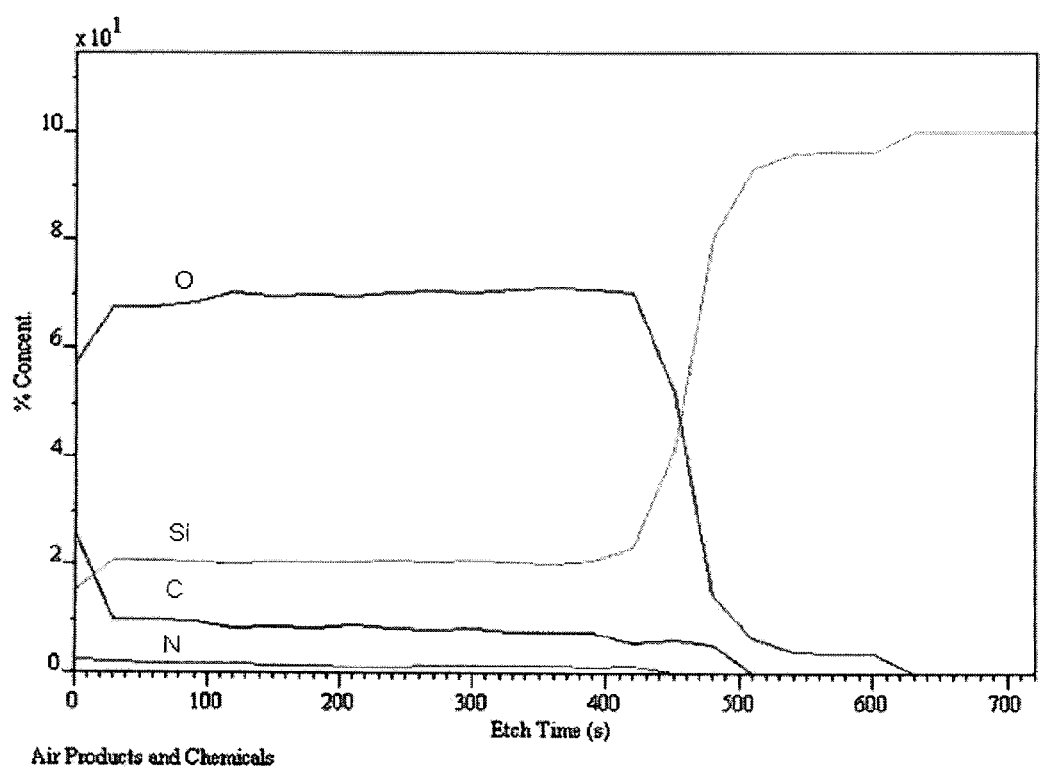
FIG. 4 is a graph showing a depth profile of a bulk composition deposited in accordance with the present invention.

FIG. 4 shows a Dynamic Secondary Ion Mass Spectroscopy (SIMS) depth profile elemental analysis of a silicon oxide film, which indicates the excellent composition uniformity of the film for silicon, oxygen, and carbon, as well as very low content of nitrogen.

The invention claimed is:

1. A low pressure, thermal chemical vapor deposition method of forming a silicon dioxide film that has extremely low wet etch rate in HF solution, comprising:
   a. delivering a first precursor that provides a source for silicon to a low pressure, thermal chemical vapor deposition reactor in which the first precursor is selected from the group consisting of: $R^1{}_nR^2{}_mSi(NR^3R^4)_{4-n-m}$, and a cyclic silazane of $(R^1R^2SiNR^3)_p$; where $R^1$ is a $C_2$-$C_{10}$ alkenyl or aromatic; $R^2$, $R^3$, and $R^4$ are selected from H, alkyl with $C_1$-$C_{10}$, linear, branched, or cyclic, an alkenyl with $C_2$-$C_{10}$ linear, branched, or cyclic, and aromatic; and n=1-3, m=0-2, p=3-4;
   b. delivering a second precursor that provide a source for oxygen to the reactor;
   c. reacting the first and second precursors at temperature between 400° C. to 700° C. under a pressure of 100 mT to 1 T.

2. The method of claim 1 in which $R^1$ is selected from the group consisting of vinyl, allyl, and phenyl.

3. The method of claim 1 in which the first precursor is Bis(isopropylamino)vinylmethylsilane.

4. The method of claim 1 in which the oxygen precursor is selected from the group consisting of oxygen, ozone and mixtures thereof.

5. An atomic layer deposition method of forming a film selected from a silicon oxide or silicon diaxide film, wherein the film has a wet etch rate in HF solutiion that is lower than an etch rate of a thermal silicon dioxide film, comprising:
   a. delivering a first precursor that provides a source for silicon to an atomic layer deposition reactor in which the first precursor is selected from the group consisting of: $R^1{}_nR^2{}_mSi(NR^3R^4)_{4-n-m}$, and a cyclic silazane of $(R^1R^2SiNR^3)_p$; where $R^1$ is a $C_2$-$C_{10}$ alkenyl or aromatic; $R^2$, $R^3$, and $R^4$ are selected from H, alkyl with $C_1$-$C_{10}$, linear, branched, or cyclic, an alkenyl with $C_2$-$C_{10}$ linear, branched, or cyclic, and aromatic; and n=1-3, m=0-2, p=3-4;
   b. purging the reactor with an inert gas;
   c. delivering a second precursor that provide a source for oxygen to the reactor;
   d. purging the reactor with an inert gas;
   e. repeating the steps between (a) and (d) until a desired thickness of the films is achieved.

6. The method of claim 5 in which $R^1$ is selected from the group consisting of vinyl, allyl, and phenyl.

7. The method of claim 5 in which the first precursor is Bis(isopropylamino)vinylmethylsilane.

8. The method of claim 5 in which the oxygen precursor is selected from the group consisting of oxygen, ozone and mixtures thereof.

9. A cyclic chemical vapor deposition method of forming a film selected from a silicon oxide or silicon dioxide film wherein the film has a wet etch rate in HF solution that is lower than an etch rate of a thermal silicon dioxide film, comprising:
   a. delivering a first precursor that provides a source for silicon to a cyclic chemical vapor deposition reactor in which the first precursor is selected from the group consisting of: R1nR2mSi(NR3R4)4-n-m, and a cyclic silazane of (R1R2SiNR3)p; where R1 is a C2-C10 alkenyl or an aromatic; R2, R3, and R4 are selected from H, alkyl with C1-C10, linear, branched, or cyclic, an alkenyl with C2-C10 linear, branched, or cyclic, and aromatic; and n=1-3, m=0-2, p=3-4;
   b. purging the reactor with an inert gas for 0.1 to 1 seconds;
   c. delivering a second precursor that provides a source of oxygen to the reactor;
   d. purging the reactor with an inert gas for 0.1-1 seconds;
   e. repeating the steps between (a) and (d) until a desired thickness of the films is achieved.

10. The method of claim 9 in which $R^1$ is selected from the group consisting of vinyl, allyl, and phenyl.

11. The method of claim 9 in which the first precursor is Bis(isopropylamino)vinylmethylsilane.

12. The method of claim 9 in which the oxygen precursor is selected from the group consisting of oxygen, ozone and mixtures thereof.

13. An atomic layer deposition method of forming a film selected from a silicon dioxide or a silicon oxide film, comprising:
   a. delivering a first precursor that provides a source for silicon to an atomic layer deposition reactor in which the first precursor comprises a compound having the following formula: $R^1{}_nR^2{}_mSi(NR^3R^4)_{4-n-m}$ where $R^1$ is a $C_2$-$C_{10}$ alkenyl or an aromatic; $R^2$, $R^3$, and $R^4$ are selected from H, alkyl with $C_1$-$C_{10}$, linear, branched, or cyclic, an alkenyl with $C_2$-$C_{10}$ linear, branched, or cyclic, and aromatic; and n=1-3 and m=0-2;
   b. purging the reactor with an inert gas;
   c. delivering a second precursor that provide a source for oxygen to the reactor;
   d. purging the reactor with an inert gas;
   e. repeating the steps between (a) and (d) until a desired thickness of the films is achieved.

14. The method of claim 13 wherein the first precursors is at least one selected from the group consisting of: Bis(isopropylamino)vinylmethylsilane (BIPAVNS), Bis(isopropylamino)divinylsilane (BIPADVS), Bis(isopropylamino)vinylsilane, Bis(isopropylamino)allylmethylsilane, Bis(isopropylamino)diallylsilane, Bis(isopropylamino)

allylsilane, Bis(t-butylamino)vinylmethylsilane, Bis(t-butylaminoamino)divinylsilane, Bis(t-butylaminoamino)vinylsilane, Bis(t-butylaminoamino)allylmethylsilane, Bis(t-butylaminoamino)diallylsilane, Bis(t-butylaminoamino)allylsilane, Bis(diethylamino)vinylmethylsilane, Bis(diethylamino)divinylsilane, Bis(diethylamino)vinylsilane, Bis(diethylamino)allylmethylsilane, Bis(diethylamino)diallylsilane, Bis(diethylamino)allylsilane, Bis(dimethylamino)vinylmethylsilane, Bis(dimethylamino)divinylsilane, Bis(dimethylamino)vinylsilane, Bis(dimethylamino)allylmethylsilane, Bis(dimethylamino)diallylsilane, Bis(dimethylamino)allylsilane, Bis(methylethylamino)vinylmethylsilane, Bis(methyethylamino)divinylsilane, Bis(methyethylamino)vinylsilane, Bis(methyethylamino)allylmethylsilane, Bis(methyethylamino)diallylsilane, Bis(methyethylamino)allylsilane,
Dipiperidinovinylmethylsilane, Dipiperidinodivinylsilane, Dipiperidinovinylsilane, Dipiperidinoallylmethylsilane, Dipiperidinodiallylsilane, Dipiperidinoallylsilane, Dipyrrolidinovinylmethylsilane, Dipyrrolidinodivinylsilane, Dipyrrolidinovinylsilane, Dipyrrolidinoallylmethylsilane, Dipyrrolidinodiallylsilane, Dipyrrolidinoallylsilane, Tris(isopropylamino)vinylsilane, Tris(isopropylamino)allylsilane, Tris(t-butylamino)vinylsilane, Tris(t-butylamino)allylsilane, Tris(diethylamino)vinylsilane, Tris(diethylamino)allylsilane, Tris(dimethylamino)vinylsilane, Tris(dimethylamino)allylsilane, Tris(methylethylamino)vinylsilane, Tris(methylethylamino)allylsilane, Tripiperidinovinylsilane, Tripiperidinoallylsilane, Tripyrrolidinovinylsilane, and Tripyrrolidinoallylsilane.

15. A cyclic chemical vapor deposition method of forming a film selected from a silicon dioxide or a silicon oxide film, comprising:
   a. delivering a first precursor that provides a source for silicon to a cyclic chemical vapor deposition reactor in which the first precursor comprises a compound having the following formula: $R^1{}_n R^2{}_m Si(NR_3 R_4)_{4-n-m}$; where $R^1$ is a $C_2$-$C_{10}$ alkenyl or an aromatic; $R^2$, $R^3$, and $R^4$ are selected from H, alkyl with $C_1$-$C_{10}$, linear, branched, or cyclic, an alkenyl with $C_2$-$C_{10}$ linear, branched, or cyclic, and aromatic; and n=1-3 and m=0-2;
   b. purging the reactor with an inert gas;
   c. delivering a second precursor that provides a source of oxygen to the reactor;
   d. purging the reactor with an inert gas;
   e. repeating the steps between (a) and (d) until a desired thickness of the films is achieved.

16. The method of claim 15 wherein the first precursors is at least one selected from the group consisting of: Bis(isopropylamino)vinylmethylsilane (BIPAVNS), Bis(isopropylamino)divinylsilane (BIPADVS), Bis(isopropylamino)vinylsilane, Bis(isopropylamino)allylmethylsilane, Bis(isopropylamino)diallylsilane, Bis(isopropylamino)allylsilane, Bis(t-butylamino)vinylmethylsilane, Bis(t-butylaminoamino)divinylsilane, Bis(t-butylaminoamino)vinylsilane, Bis(t-butylaminoamino)allylmethylsilane, Bis(t-butylaminoamino)diallylsilane, Bis(t-butylaminoamino)allylsilane, Bis(diethylamino)vinylmethylsilane, Bis(diethylamino)divinylsilane, Bis(diethylamino)vinylsilane, Bis(diethylamino)allylmethylsilane, Bis(diethylamino)diallylsilane, Bis(diethylamino)allylsilane, Bis(dimethylamino)vinylmethylsilane, Bis(dimethylamino)divinylsilane, Bis(dimethylamino)vinylsilane, Bis(dimethylamino)allylmethylsilane, Bis(dimethylamino)diallylsilane, Bis(dimethylamino)allylsilane, Bis(methylethylamino)vinylmethylsilane, Bis(methyethylamino)divinylsilane, Bis(methyethylamino)vinylsilane, Bis(methyethylamino)allylmethylsilane, Bis(methyethylamino)diallylsilane, Bis(methyethylamino)allylsilane,
Dipiperidinovinylmethylsilane, Dipiperidinodivinylsilane, Dipiperidinovinylsilane, Dipiperidinoallylmethylsilane, Dipiperidinodiallylsilane, Dipiperidinoallylsilane, Dipyrrolidinovinylmethylsilane, Dipyrrolidinodivinylsilane, Dipyrrolidinovinylsilane, Dipyrrolidinoallylmethylsilane, Dipyrrolidinodiallylsilane, Dipyrrolidinoallylsilane, Tris(isopropylamino)vinylsilane, Tris(isopropylamino)allylsilane, Tris(t-butylamino)vinylsilane, Tris(t-butylamino)allylsilane, Tris(diethylamino)vinylsilane, Tris(diethylamino)allylsilane, Tris(dimethylamino)vinylsilane, Tris(dimethylamino)allylsilane, Tris(methylethylamino)vinylsilane, Tris(methylethylamino)allylsilane, Tripiperidinovinylsilane, Tripiperidinoallylsilane, Tripyrrolidinovinylsilane, and Tripyrrolidinoallylsilane.

* * * * *